US006836161B2

(12) United States Patent
Akiyama et al.

(10) Patent No.: US 6,836,161 B2
(45) Date of Patent: Dec. 28, 2004

(54) SEMICONDUCTOR SWITCH DRIVING CIRCUIT

(75) Inventors: Naoto Akiyama, Tokyo (JP); Masahiko Inomata, Tokyo (JP); Ikuhiro Tsumura, Tokyo (JP)

(73) Assignee: Nihon Kohden Corporation, Tokyo (JP)

( * ) Notice: Subject to any disclaimer, the term of this patent is extended or adjusted under 35 U.S.C. 154(b) by 216 days.

(21) Appl. No.: 09/813,978

(22) Filed: Mar. 22, 2001

(65) Prior Publication Data

US 2001/0044640 A1 Nov. 22, 2001

(30) Foreign Application Priority Data

Mar. 22, 2000 (JP) .................................... P. 2000-080985

(51) Int. Cl.[7] .................................................. H03K 3/00

(52) U.S. Cl. ....................... 327/108; 327/109; 327/110; 327/387

(58) Field of Search ................................ 327/108, 109, 327/110, 111, 112, 432, 434, 325, 326, 387, 388, 389

(56) References Cited

U.S. PATENT DOCUMENTS 4,308,577 A * 12/1981 Mentler ...................... 363/134
5,087,863 A * 2/1992 Nero .......................... 315/388
5,168,182 A 12/1992 Salerno et al.
5,301,085 A 4/1994 Miettinen
5,404,059 A * 4/1995 Loffler ........................ 327/478
5,469,098 A 11/1995 Johnson, Jr.
5,504,449 A 4/1996 Prentice
5,530,385 A 6/1996 Miettinen
5,686,854 A 11/1997 Smith
5,763,962 A * 6/1998 Tsurumi ..................... 327/482
5,781,040 A 7/1998 Myers
5,891,172 A 4/1999 Stendahl et al. ............... 607/5
5,909,138 A 6/1999 Stendahl ..................... 327/434
5,910,738 A 6/1999 Shinohe et al.
5,910,746 A 6/1999 Fordyce
5,912,810 A 6/1999 Jacobs et al.
5,939,927 A 8/1999 Myers

* cited by examiner

*Primary Examiner*—Timothy P. Callahan
*Assistant Examiner*—An T. Luu
(74) *Attorney, Agent, or Firm*—Sughrue Mion, PLLC

(57) ABSTRACT

To provide a semiconductor switch driving circuit in which a stable conducting state and a non-conducting state can be kept, the high-speed switching operation is enabled, a lag of switching timing is minimized and which has a simple circuit, the semiconductor switch driving circuit for driving a semiconductor switch in which multistage switching devices (IGBT) are connected includes a transformer, a primary side and a secondary side and is configured so that voltage between the gate and the emitter of a switching device can be continuously kept positive, voltage between the gate and the emitter can be continuously kept negative, voltage between the gate and the emitter is alternately switched to positive voltage or negative voltage.

10 Claims, 4 Drawing Sheets

--PRIOR ART--

SEMICONDUCTOR SWITCH DRIVING CIRCUIT

BACKGROUND OF THE INVENTION

1. Field of the Invention

The present invention relates to a semiconductor switch driving circuit, particularly relates to a semiconductor switch driving circuit suitable for controlling a semiconductor switch used for electrotherapy apparatus such as a defibrillator.

2. Related Art

For a device for a semiconductor switch which enables the control of high voltage, an insulated gate bipolar transistor (IGBT) is generally used.

A circuit for driving a semiconductor switch configured by this insulated gate bipolar transistor (hereinafter called IGBT) is connected via a photocoupler or a transformer so that the circuit is electrically insulated from a circuit part that directly drives a control signal and the gate of IGBT.

Referring to drawings, an example using a photocoupler and an example using a pulse transformer respectively of a conventional type semiconductor switch driving circuit will be described below.

FIG. 3 is a circuit diagram showing a semiconductor switch driving circuit using a photocoupler.

As shown in FIG. 3, a part that drives a switching device (IGBT) 208*a* at a first stage is composed of a photocoupler 201*a*, a comparator 202*a*, a positive voltage source 203*a*, transistors 204*a* and 205*a*, a negative voltage source 206*a* and a resistor 207*a* and a ground terminal is connected to a GND1. Also, a part that drives a switching device (IGBT) 208*b* at a second stage is composed of a photocoupler 201*b*, a comparator 202*b*, a positive voltage source 203*b*, transistors 204*b* and 205*b*, a negative voltage source 206*b* and a resistor 207*b*, a ground terminal is connected to a GND2 and a driving circuit at the next stage or at the subsequent stages can be similarly composed.

FIG. 4 is a circuit diagram showing a semiconductor switch driving circuit using a pulse transformer.

As shown in FIG. 4, a part that drives a switching device (IGBT) 257*a* at a first stage connected to a secondary side of a pulse transformer 251 is composed of a transistor 255*a*, diodes 252*a* and 253*a* and resistors 254*a* and 256*a*, a part that drives a switching device (IGBT) 257*b* at a second stage is composed of a transistor 255*b*, diodes 252*b* and 253*b* and resistors 254*b* and 256*b* and a driving circuit at the next stage or the subsequent stages can be similarly composed.

However, the conventional type semiconductor switch driving circuit has the following problems.

The semiconductor switch driving circuit shown in FIG. 3 is provided with the photocoupler, the positive voltage source, the negative voltage source and the GND at every stage of a driven switching device (IGBT). In a conventional type system of a multistage semiconductor switch, there is a problem of a time lag in the switching of a switching device (IGBT). When the timing of the switching is delayed, overvoltage is applied to a switching device in case switching devices are connected in series as shown in FIG. 3, also, in case switching devices are connected in parallel, over current is applied to a switching device and in any case, the switching device may be broken. Also, as the same number of the photocouplers, the positive voltage sources, the negative voltage sources and the grounds as the number of the stages of the switching devices (IGBT) are required, there is a problem that the scale of the circuit is large and the cost of the whole apparatus is high.

Also, the semiconductor switch driving circuit shown in FIG. 4 cannot continuously supply positive voltage or negative voltage to the gate of the switching device (IGBT) to be driven. There is also a problem that switching to reverse bias (from positive voltage to negative voltage or from negative voltage to positive voltage) is slow.

Further, there are problems that positive voltage or negative voltage cannot be made to an independent value and the size of a transformer for low-frequency switching is large.

SUMMARY OF THE INVENTION

The invention is made to solve the problems of the prior art and the object is to provide a semiconductor switch driving circuit suitable for controlling a semiconductor switch which can continuously supply positive voltage or negative voltage to the gate of a switching device (IGBT) to be driven by the small number of parts, enables high-speed switching to reverse bias and is particularly used for electrotherapy apparatus because a lag in switching timing between each stage can be reduced.

To achieve the object, a semiconductor switch driving circuit according to a first aspect of the invention is based upon a semiconductor switch driving circuit provided with at least a transformer and is characterized in that a primary side area for controlling the primary current of the transformer according to a control signal for controlling a semiconductor switch is provided on the primary side of the transformer, a secondary side area for directly driving a switching device is provided on the secondary side of the transformer, voltage between the gate and the emitter of the switching device can be continuously kept positive, voltage between the gate and the emitter can be continuously kept negative and voltage between the gate and the emitter can be switched so that it is alternately positive and negative.

A semiconductor switch driving circuit according to a second and a third aspect of the invention is characterized in that the circuit is operated in synchronization with an input control signal because the primary side area is configured so that the primary side area receives a control signal, transmits power for controlling plural switching devices to the secondary side area and absorbs back electromotive force caused when current flowing in the transformer is cut off and the secondary side area is configured so that the secondary side area receives the power supplied from the primary side area, transmits the power for controlling the plural switching devices to the plural switching devices, the plural switching devices receive the power supplied to the secondary side area of the semiconductor switch driving circuit and cause or prevent current to flow for switching.

A semiconductor switch driving circuit according to a fourth aspect of the invention is characterized in that back electromotive force between a terminal at one end of a primary winding of a transformer and a terminal at the other end of the primary winding of the transformer can be inhibited by connecting the source of P channel MOSFET to a power terminal, connecting the drain of the P channel MOSFET to the anode of a diode, connecting the cathode of the diode to the terminal at one end of the primary winding of the transformer and as a result, conducting the P channel MOSFET.

A semiconductor switch driving circuit according to a fifth aspect of the invention is characterized in that when the primary side area receives an input control signal, it transmits power for controlling plural switching devices to a secondary side area and absorbs back electromotive force caused when current flowing in the transformer is cut off because a control signal input terminal is connected to the base of an NPN bipolar transistor via a resistor and a capacitor respectively connected in parallel, the base and the emitter of the NPN bipolar transistor are connected via a resistor, the emitter is connected to a ground terminal, the collector of the NPN bipolar transistor is connected to the gate of a P-channel MOSFET via a resistor, the gate and the source of the P-channel MOSFET are connected via a resistor, the source is connected to a power terminal, the drain of the P-channel MOSFET is connected to the anode of a diode, the cathode of the diode is connected to the drain of a N-channel MOSFET and a terminal of a primary winding of a transformer, the gate and the source of the N-channel MOSFET are connected via a resistor, the source is connected to a ground terminal, a control signal input terminal is connected to the gate of the N-channel MOSFET via a resistor, a control signal input terminal is connected to the base of an NPN bipolar transistor via a resistor and a capacitor respectively connected in parallel, the base and the emitter of the NPN bipolar transistor are connected via a resistor, the emitter is connected to a ground terminal, the collector of the NPN bipolar transistor is connected to the gate of a P-channel MOSFET via a resistor, the gate and the source of the P-channel MOSFET are connected via a resistor, the source is connected to a power terminal, the drain of the P-channel MOSFET is connected to the anode of a diode, the cathode of the diode is connected to the drain of a N-channel MOSFET and a terminal of the primary winding of the transformer, the gate and the source of the N-channel MOSFET are connected via a resistor, the source is connected to a ground terminal, a control signal input terminal is connected to the gate of the N-channel MOSFET via a resistor, terminals of the primary winding of the transformer are connected to a center tap, the center tap is connected to a power terminal and the center tap is connected to a ground terminal via a capacitor.

A semiconductor switch driving circuit according to a sixth aspect of the invention is characterized in that the withstand voltage against the application of high voltage to a semiconductor switch is a value acquired by adding the withstand voltage of the switching device itself at each stage because the secondary side area is provided with plural switching devices and plural gate driving sections that directly drives the switching device and the plural switching devices are connected in series.

A semiconductor switch driving circuit according to a seventh aspect of the invention is characterized in that as the switching device is made of an insulated gate bipolar transistor (IGBT), it is a device (IGBT) provided with both the low-saturation voltage characteristic of a bipolar transistor and the switching characteristic of power MOSFET.

A semiconductor switch driving circuit according to an eighth aspect of the invention is characterized in that a Zener diode for preventing electromotive force generated on a secondary winding by back electromotive force caused on a primary winding of the transformer is provided to the secondary side area.

A semiconductor switch driving circuit according to aninth aspect of the invention is characterized in that the secondary side area receives power supplied from a primary side area and transmits the power for controlling plural switching devices to the plural switching devices because a terminal at one end of a secondary winding of the transformer is connected to a first Zener diode, a second Zener diode is connected to the gate of a specific switching device via a first resistor, same kind of polarities of the first and the second Zener diode are directly connected in series with the polarities face to face, a terminal at the other end of the secondary winding of the transformer is connected to the emitter of the specific switching device, a second resistor and a capacitor are connected between the second Zener diode and the emitter of the specific switching device and a structure comprising the secondary windings of the transformer and the switching device connected via the gate driving section is plurally provided.

An electrotherapy apparatus according to a tenth aspect of the invention is characterized in that the semiconductor switch driving circuit according to any of the first to the ninth aspects of the invention is used for a semiconductor switch having a circuit for generating a high-voltage electric pulse and a high-voltage electric pulse is supplied to an outside living body from an output terminal of the electrotherapy apparatus.

DETAILED DESCRIPTION OF PREFERRED EMBODIMENT

Figure 1:
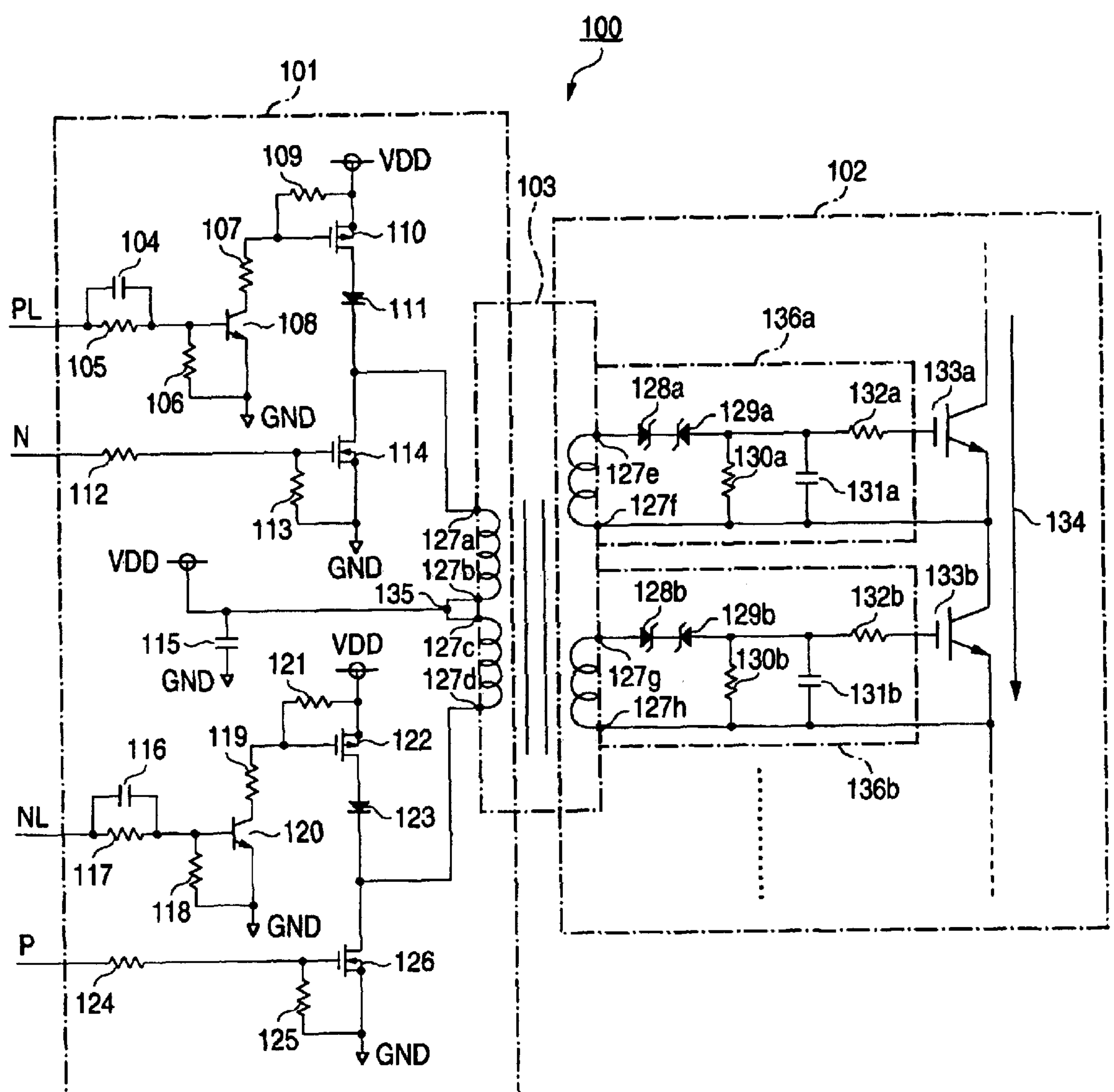
FIG. 1 is a circuit diagram showing a semiconductor switch driving circuit according to the invention.

Referring to the drawings, an embodiment of a semiconductor switch driving circuit according to the invention will be described in detail below.

FIG. 1 is a circuit diagram for explaining an embodiment of the semiconductor switch driving circuit according to the invention.

As shown in FIG. 1, a semiconductor switch driving circuit 100 for driving a semiconductor switch in which multistage switching devices (IGBT) are connected is composed of a transformer 103, its primary side area 101 and its secondary side area 102.

The primary side area 101 is composed as follows.

A control input terminal (for a signal PL) is connected to the base of an NPN bipolar transistor 108 via a resistor 105 and a capacitor 104 respectively connected in parallel, the base and the emitter of the NPN bipolar transistor 108 are connected via a resistor 106 and are connected to a ground terminal GND.

The collector of the NPN bipolar transistor 108 is connected to the gate of a P channel MOSFET 110 via a resistor 107, the gate and the source of the P channel MOSFET 110 are connected via a resistor 109 and are connected to a power terminal VDD.

The drain of the P channel MOSFET 110 is connected to the anode of a diode 111 and the cathode of the diode 111 is connected to the drain of a N channel MOSFET 114 and a terminal 127*a* of a primary winding of the transformer 103.

The gate and the source of the N channel MOSFET 114 are connected via a resistor 113 and are connected to a ground terminal GND. A control input terminal (for a signal N) is connected to the gate of the N channel MOSFET 114 via a resistor 112.

A control input terminal (for a signal NL) is connected to the base of an NPN bipolar transistor 120 via a resistor 117 and a capacitor 116 respectively connected in parallel, and the base and the emitter of the NPN bipolar transistor 120 are connected via a resistor 118 and are connected to a ground terminal GND.

The collector of the NPN bipolar transistor 120 is connected to the gate of a P channel MOSFET 122 via a resistor 119, the gate and the source of the P channel MOSFET 122 are connected via a resistor 121 and are connected to a power terminal VDD.

The drain of the P channel MOSFET 122 is connected to the anode of a diode 123 and the cathode of the diode 123 is connected to the drain of a N channel MOSFET 126 and a terminal 127*d* of the primary winding of the transformer 103.

The gate and the source of the N channel MOSFET 126 are connected via a resistor 125 and are connected to a ground terminal GND. A control input terminal (for a signal P) is connected to the gate of the N channel MOSFET 126 via a resistor 124.

Terminals 127*b* and 127*c* of the primary winding of the transformer 103 are connected to a center tap 135, further, the center tap 135 is connected to a power terminal VDD and is connected to a ground terminal GND via a capacitor 115.

The secondary side area 102 is composed as follows.

The emitter of a switching device (IGBT) 133*a* at a first stage and the collector of a switching device (IGBT) 133*b* at a second stage are connected, in case there are switching devices (IGBT) at stages following the second stage though they are not shown, they are similarly connected and multistage switching devices (IGBT) are connected in series.

Gate driving sections 136*a* and 136*b* for directly controlling voltage between the gate and the emitter of each switching device (IGBT) are respectively composed as follows.

In the gate driving section 136*a*, the anode of a (first) Zener diode 128*a* is connected to a terminal 127*e* at one end of a secondary winding of the transformer 103 and the cathode of a (second) Zener diode 129*a* is directly connected to the cathode of the (first) Zener diode 128*a* in series with both cathodes face to face and the anode of the (second) Zener diode 129*a* is connected to the gate of the switching device (IGBT) 133*a* via a (first) resistor 132*a*, a terminal 127*f* at the other end of the secondary winding is connected to the emitter of the switching device (IGBT) 133*a*, and a (second) resistor 130*a* and a capacitor 131*a* are connected between the anode of the (second) Zener diode 129*a* and the emitter of the switching device (IGBT) 133*a*.

In the gate driving section 136*b*, the anode of a (first) Zener diode 128*b* is connected to a terminal 127*g* at one end of the second winding of the transformer 103 and the cathode of a (second) Zener diode 129*b* is directly connected to the cathode of the (first) Zener diode 128*b* in series with the cathodes face to face and the anode of the (second) Zener diode 129*b* is connected to the gate of the switching device (IGBT) 133*b* via a (first) resistor 132*b*, a terminal 127*h* at the other end of the secondary winding is connected to the emitter of the switching device (IGBT) 133*b*, and a (second) resistor 130*b* and a capacitor 131*b* are connected between the anode of the (second) Zener diode 129*b* and the emitter of the switching device (IGBT) 133*b*.

Though not shown, in case there are gate driving sections at stages following the second stage, they are similarly composed.

Next, the function of each side will be described.

In the primary side area 101 of the semiconductor switch driving circuit, a control signal is input to transmit power for controlling plural switching devices (IGBT) 133*a* and 133*b* to the secondary side area 102 of the semiconductor switch driving circuit. Also, the primary side absorbs back electromotive force caused when current flowing in the primary winding of the transformer 103 is cut off.

The secondary side area 102 of the semiconductor switch driving circuit receives power supplied from the primary side area 101 of the semiconductor switch driving circuit and transmits power for controlling the plural switching devices (IGBT) 133*a* and 133*b* to the plural switching devices (IGBT) 133*a* and 133*b*.

These switching devices (IGBT) 133*a* and 133*b* at each stage receive the power supplied to the secondary side area 102 and cause or prevent current for switching 134 to flow.

Further, the function of each circuit component will be described below.

The capacitor 104 speeds up turning on/turning off the bipolar transistor 108.

The resistor 105 limits the base current of the bipolar transistor 108.

The resistor 106 equalizes the base potential of the bipolar transistor 108 to the potential of the emitter.

The resistor 107 limits the collector current of the bipolar transistor 108.

The bipolar transistor 108 executes the on-off control of the P channel MOSFET 110.

The resistor 109 equalizes the gate potential of the P channel MOSFET 110 to the potential of the source.

The P channel MOSFET 110 suppresses voltage caused at the terminal 127*a* of the primary winding of the transformer 103 by back electromotive force when the N channel MOSFET 126 is turned off.

The diode 111 suppresses voltage caused at the terminal 127*a* of the primary winding of the transformer 103 by back electromotive force when the N channel MOSFET 126 is turned off so that the voltage at the terminal 127*a* is at an optimum level. The diode 111 also prevents current in the P channel MOSFET 110 from flowing in a reverse direction by voltage which will be caused by higher voltage than the source voltage at the terminal 127*a* of the transformer 103 when the N channel MOSFET 126 is turned on The resistor 112 limits the gate current of the N channel MOSFET 114.

The resistor 113 equalizes the gate potential of the N channel MOSFET 114 to the potential of the source.

The N channel MOSFET 114 controls the supply of current to the primary winding of the transformer 103.

The capacitor 115 smoothes source voltage supplied to the transformer 103.

The capacitor 116 contributes to speedup when the bipolar transistor 120 is turned on or turned off.

The resistor 117 limits the base current of the bipolar transistor 120.

The resistor 118 equalizes the base potential of the bipolar transistor 120 to the potential of the collector.

The resistor 119 limits the collector current of the bipolar transistor 120.

The bipolar transistor 120 controls turning on/off the P channel MOSFET 122.

The resistor 121 equalizes the gate potential of the P channel MOSFET 122 to the potential of the source.

The P channel MOSFET 122 suppresses voltage caused at the terminal 127*d* of the primary winding of the transformer 103 by back electromotive force when the N channel MOSFET 114 is turned off.

The diode 123 suppresses voltage caused at the terminal 127*d* of the primary winding of the transformer 103 by back electromotive force when the N channel MOSFET 114 is turned off so that the voltage is at an optimum level. The diode 123 also prevents current in a reverse direction from flowing in the P channel MOSFET 122 by voltage which will be caused by higher voltage than the source voltage at the terminal 127*d* of the transformer 103 when the N channel MOSFET 114 is turned on.

The resistor 124 limits the base current of the N channel MOSFET 126.

The resistor 125 equalizes the gate potential of the N channel MOSFET 126 to the potential of the source.

The N channel MOSFET 126 controls the supply of current to the primary winding of the transformer 103.

The transformer 103 insulates between the primary side and the secondary side of the semiconductor switch driving circuit, insulates each stage of the secondary side and transmits power from the primary side to the secondary side.

The Zener diode 128*a* connects a positive voltage supply path to the switching device (IGBT) 133*a* and prevents voltage caused between the terminals 127*e* and 127*f* of the secondary winding of the transformer 103 by back electromotive force of the transformer 103.

The Zener diode 129*a* connects a negative voltage supply path to the switching device (IGBT) 133*a* and prevents voltage caused between the terminals 127*e* and 127*f* of the secondary winding of the transformer 103 by back electromotive force of the transformer 103.

The resistor 130*a* equalizes the gate potential of the switching device (IGBT) 133*a* to the potential of the emitter.

The capacitor 131*a* keeps the gate voltage of the switching device (IGBT) 133*a* and corrects dispersion in the gate capacitance between the plural switching devices (IGBT) 133*a* and 133*b*.

The resistor 132*a* limits the gate current of the switching device (IGBT) 133*a*.

The switching device (IGBT) 133*a* causes or prevents the current for switching 134 to flow.

Also, the driving section (including the Zener diodes 128*b* and 129*b*, the resistor 130*b*, the capacitor 131*b* and the resistor 132*b*) of the switching device (IGBT) 133*b* at the second stage similarly functions.

Next, referring to the circuit diagram shown in FIG. 1 and timing charts shown in FIGS. 2(*a*) to (*c*), the operation of the semiconductor switch driving circuit equivalent to this embodiment will be described.

Figure 2:
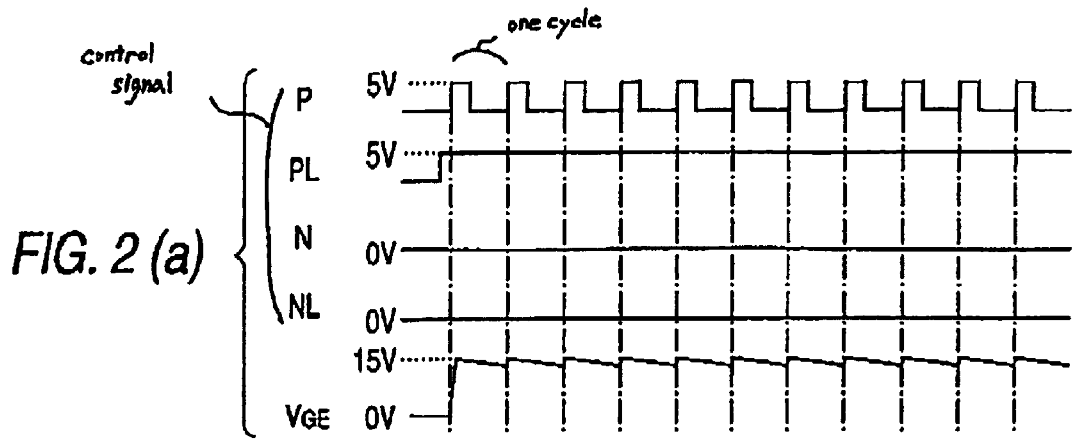
FIGS. 2(*a*) to (*c*) are timing charts showing each operation of the semiconductor switch driving circuit according to the invention.
Figure 2:
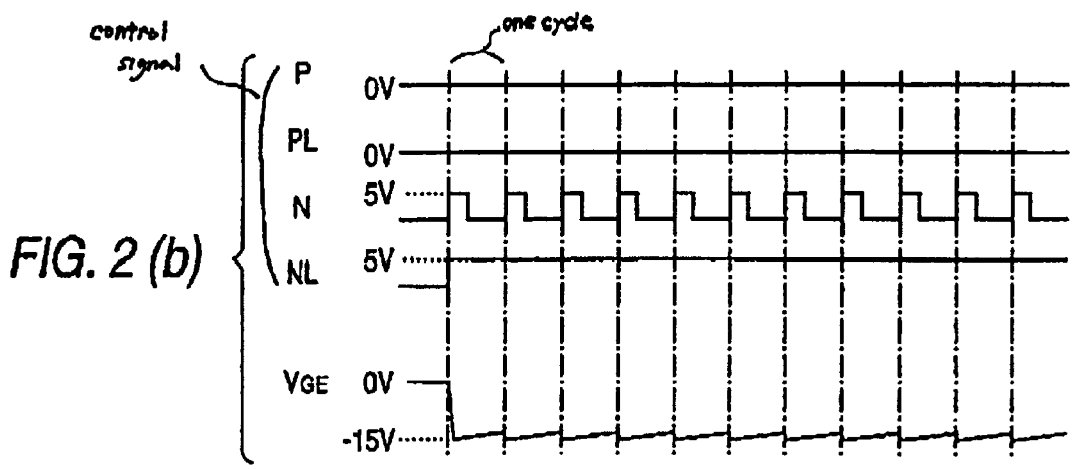
Figure 2:
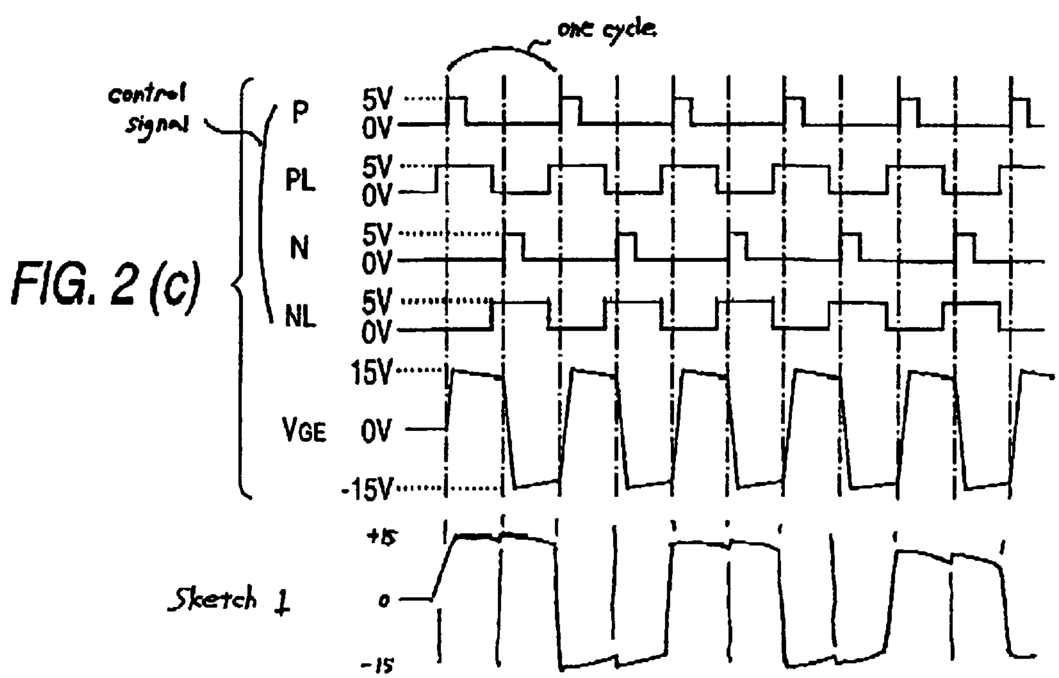
Figure 3:
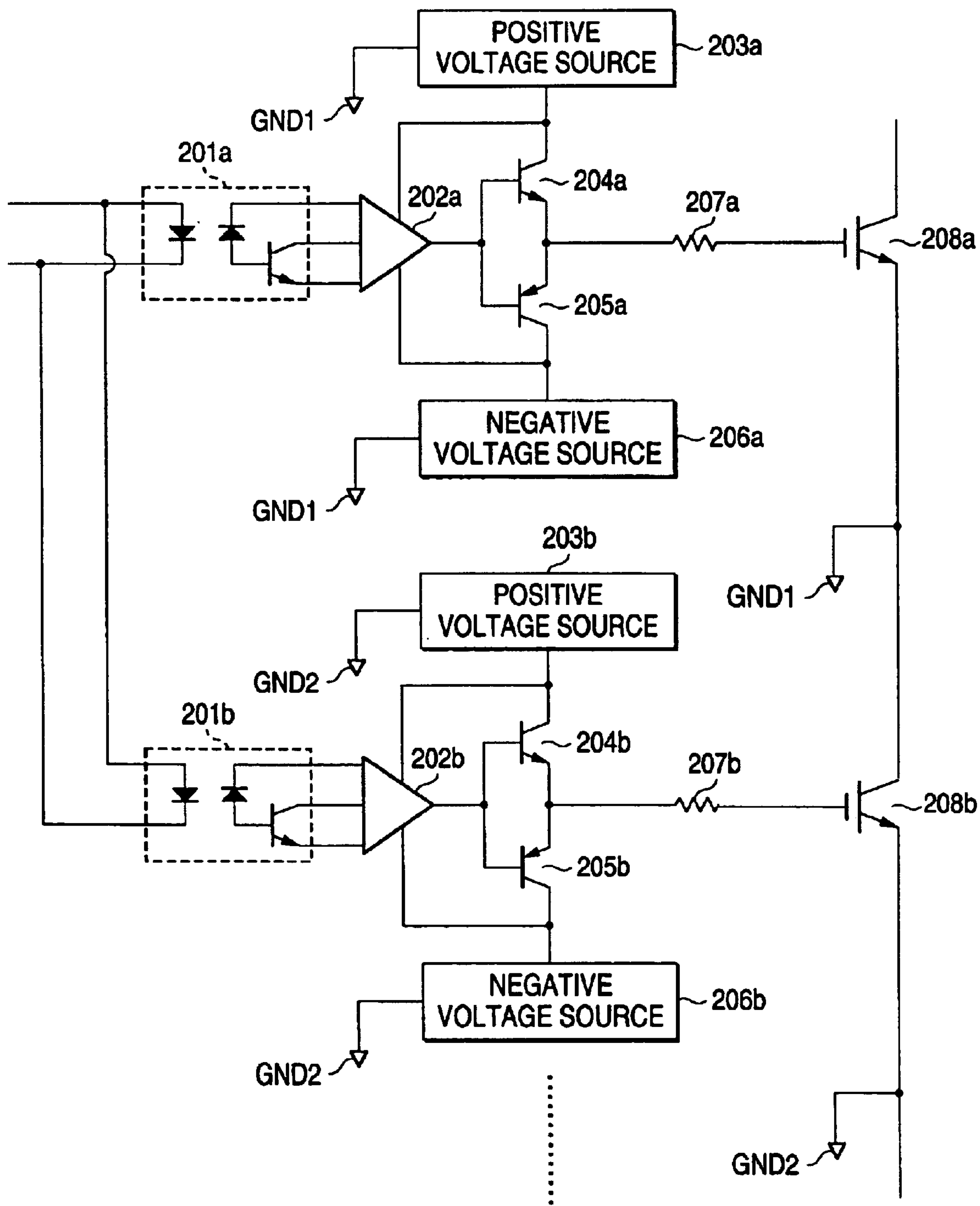
FIG. 3 is a circuit diagram showing a conventional type semiconductor switch driving circuit using a photocoupler.
Figure 4:
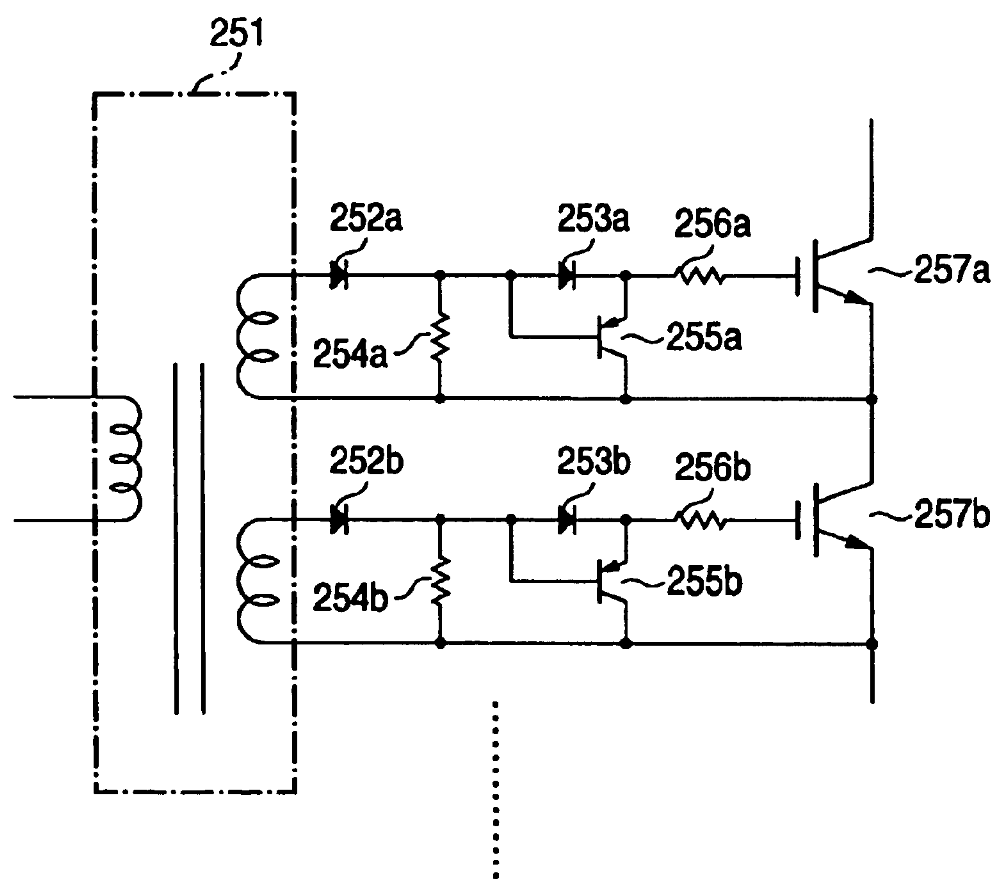
FIG. 4 is a circuit diagram showing a conventional type semiconductor switch driving circuit using a pulse transformer.

FIG. 2(*a*) shows operation for keeping the semiconductor switch conducting (continuously supplying positive voltage).

The operation in the primary side area 101 of the semiconductor switch driving circuit in this operation is as described in the following a-1 to a-8.

a-1: Signals N and NL input to the primary side area 101 of the semiconductor switch driving circuit are kept 0 V on the circuit.

a-2: The level of an input signal PL is changed from 0 V to a level at which the bipolar transistor 108 can be turned on (for example, +5 V).

a-3: The bipolar transistor 108 becomes a conducting state.

a-4: The P channel MOSFET 110 becomes a conducting state.

a-5: After time enough to turn off the bipolar transistor 120 and the P channel MOSFET 122 elapses (for example, in 1 μs.) after the level of the input signal NL is made to 0 v in a-1, the level of an input signal P is changed from 0 V to a level at which the N channel MOSFET 126 can be turned on (for example, +5 V).

a-6: The N channel MOSFET 126 becomes a conducting state.

a-7: Current flows from the terminal 127*c* to the terminal 127*d* in the primary winding of the transformer 103 from the center tap 135 toward the N channel MOSFET 126.

a-8: Electromotive force V2p which is positive on the side of the terminal 127*e* and is negative on the side of the terminal 127*f* (is similarly positive on the side of the terminal 127*g* and is similarly negative on the side of the terminal 127*h*) is generated at both ends of each secondary winding of the transformer 103 (refer to the following mathematical equation 1).

$$V2p = V1 \times N2/N1 \tag{1}$$

In the mathematical equation 1, V1 denotes voltage applied between the terminals 127*c* and 127*d* of the transformer 103, N1 denotes the number of turns between the terminals 127*c* and 127*d* and between the terminals 127*a* and 127*b* of the transformer 103 and N2 denotes the number of turns between the terminals 127*e* and 127*f* and between the terminals 127*g* and 127*h* of the transformer 103.

Next, the operation in the secondary side area 102 of the semiconductor switch driving circuit in this operation is as described in the following a-9 to a-18.

The driving section of one switching device (IGBT) 133*a* of the semiconductor switch having plural stages will be described below, however, the operation of the switching device (IGBT) 133*b* at another stage and others are also similar.

a-9: Electromotive force V2p at both ends of each secondary winding increases and exceeds voltage acquired by adding Zener voltage $V_{z29}$ of the Zener diode 129*a* and the dropout voltage $v_{f28}$ in a forward direction of the Zener diode 128*a* (refer to a mathematical equation 2).

$$V2p > V_{z29} + V_{f28} \tag{2}$$

a-10: The Zener diode 129*a* becomes a conducting state.

a-11: The capacitor 131*a* is charged (the side of the Zener diode 129*a* is positive) and the gate capacitance of the switching device (IGBT) 133*a* is charged (the side of the gate is positive) via the resistor 132*a*.

a-12: The gate voltage $V_{GE}$ of the switching device (IGBT) 133*a* exceeds the gate threshold voltage $V_{GE(TH)}$ (a condition of the mathematical equation 3) and the switching device (IGBT) 133*a* becomes a conducting state.

$$V_{GE33} > V_{GE(TH)} \tag{3}$$

a-13: After the gate voltage $V_{GE33}$ of the switching device (IGBT) 133*a* becomes at a level (for example, +15 V) enough to keep the switching device conducting (for example, in 2.5 μs.), an input signal P is made to 0 V.

a-14: The N channel MOSFET 126 becomes a non-conducting state.

a-15: Back electromotive force which is positive on the side of the terminal 127*d* and is negative on the side of the terminal 127*a* is caused on the primary winding of the transformer 103, however, as the terminal 127*a* on one side of the winding is connected to a power source via the P channel MOSFET 110 and the diode 111 which are respectively in a conducting state, back electromotive force $V1_{rev}$ caused between the terminals 127*a* and 127*d* is inhibited as shown in a mathematical equation 4.

$$V1_{rev}=(V_{d*10}+V_{f11})\times 2 \quad (4)$$

$V_{d*10}$ denotes the dropout voltage of the P channel MOSFET 110 and $V_{f11}$ denotes the dropout voltage in a forward direction of the diode 111.

a-16: Electromotive force $V2p_{rev}$ which is positive on the side of the terminal 127*f* and is negative on the side of the terminal 127*e* is also caused on the secondary winding by back electromotive force $V1_{rev}$ caused on the primary winding of the transformer 103, however, the level is Zener voltage $V_{z28}$ of the Zener diode 128*a* or less and the circuit on the secondary side becomes a non-conducting state by the Zener diode 128*a* (refer to a mathematical equation 5).

$$V2p_{rev}=(V1_{rev}\times N2/N1)<V_{z28} \quad (5)$$

a-17: The gate voltage $V_{GE33}$ of the switching device (IGBT) 133*a* decreases according to a time constant determined based upon the resistor 130*a*, the capacitor 131*a* and the resistor 132*a* and the gate capacitance of the switching device (IGBT) 133*a*.

This time constant is determined so that the gate voltage $V_{GE33}$ of the switching device (IGBT) 133*a* can continue to keep the voltage enough to keep the switching device conducting for time enough for magnetic energy stored in the core of the transformer 103 to be consumed.

a-18: Before the gate voltage $V_{GE33}$ of the switching device (IGBT) 133*a* is the gate threshold voltage $V_{GE<TH>}$ or less and after magnetic energy stored in the core of the transformer 103 is consumed, the level of an input signal P is changed from 0 V to a level at which the N channel MOSFET 126 can be turned on (for example, +5 V).

Afterward, a-6 to a-18 are repeated.

The same operation is also performed at the same timing in the driving sections of the switching device (IGBT) 133*b* at another stage and others.

FIG. 2(*b*) shows operation for keeping the semiconductor switch non-conducting (continuously supplying negative voltage). The operation in the primary side area 101 of the semiconductor switch driving circuit in this operation is as described in the following b-1 to b-8.

b-1: Signals P and PL input to the primary side area 101 of the semiconductor switch driving circuit are kept 0 V on the circuit.

b-2: The level of an input signal NL is changed from 0 V to a level at which the bipolar transistor 120 can be turned on (for example, +5 V).

b-3: The bipolar transistor 120 becomes a conducting state.

b-4: The P channel MOSFET 122 becomes a conducting state.

b-5: After time enough to turn off the bipolar transistor 108 and the P channel MOSFET 110 elapses (for example, in 1 μs.) after the input signal PL is made to 0 V, the level of an input signal N is changed from 0 V to a level at which the N channel MOSFET 114 can be turned on (for example, +5 V).

b-6: The N channel MOSFET 114 becomes a conducting state.

b-7: Current flows (from the terminal 127*b* to the terminal 127*a*) in the primary winding of the transformer 103 from the center tap toward the N channel MOSFET 114.

b-8: Electromotive force $V2n$ which is positive on the side of the terminal 127*f* and is negative on the side of the terminal 127*e* (is similarly positive on the side of the terminal 127*h* and is similarly negative on the side of the terminal 127*g*) is generated at both ends of each secondary winding of the transformer 103 (refer to a mathematical equation 6).

$$V2n=V1\times N2/N1 \quad (6)$$

V1 denotes voltage applied between the terminals 127*b* and 127*a* of the transformer 103, N1 denotes the number of turns between the terminals 127*a* and 127*b* and between the terminals 127*c* and 127*d* of the transformer 103 and N2 denotes the number of turns between the terminals 127*e* and 127*f* and between the terminals 127*g* and 127*h* of the transformer 103.

Next, the operation in the secondary side area 102 of the semiconductor switch driving circuit in this operation is as described in the following b-9 to b-18.

The driving section of one switching device (IGBT) 133*a* of the semiconductor switch at plural stages will be described, however, the operation of the switching device (IGBT) 133*b* at another stage and others is also similar.

b-9: Electromotive force V2n at both ends of each secondary winding increases and exceeds voltage acquired by adding Zener voltage $V_{z28}$ of the Zener diode 128*a* and the dropout voltage $V_{f29}$ in a forward direction of the Zener diode 129*a*.

$$V2n>V_{Z28}+V_{f29} \quad (7)$$

b-10: The Zener diode 128*a* becomes a conducting state.

b-11: The capacitor 131*a* is charged (the side of the Zener diode 129*a* is negative) and the gate capacitance of the switching device (IGBT) 133*a* is charged (the side of the gate is negative) via the resistor 132*a*.

b-12: The gate voltage $V_{GE}$ of the switching device 133*a* becomes negative and the switching device is forcedly non-conducting.

b-13: After the gate voltage $V_{GE}$ of the switching device 133*a* becomes at a level (for example, −15 V) enough to keep the switching device non-conducting (for example, in 2.5 μs.), an input signal N is made to 0 V.

b-14: The N channel MOSFET 114 becomes a non-conducting state.

b-15: Back electromotive force which is positive on the side of the terminal 127*a* and is negative on the side of the terminal 127*d* is caused on the primary winding of the transformer 103, however, as the terminal 127*d* at one end of the winding is connected to a power source via the P channel MOSFET 122 and the diode 123 which are respectively in a conducting state, the caused back electromotive force $V1_{rev}$ is inhibited as shown in the following mathematical equation 8.

$$V1_{rev}=(V_{ds22}+V_{f23})\times 2 \quad (8)$$

$V_{ds22}$ denotes the dropout voltage of the P channel MOSFET 122 and $V_{f23}$ denotes the dropout voltage in a forward direction of the diode 123.

b-16: Electromotive force $V2n_{rov}$ which is positive on the side of the terminal 127*e* and is negative on the side of the terminal 127*f* is also generated on the secondary winding by back electromotive force $V1_{rev}$ caused on the primary winding of the transformer 103, however, the level is Zener voltage $V_{z29}$ of the Zener diode 129*a* or less and the circuit on the secondary side becomes a non-conducting state by the Zener diode 129*a* (refer to a mathematical equation 9).

$$V2n_{rov}=(V1_{rev}\times N2/N1)<V_{z29}$$

b-17: The gate voltage $V_{GE33}$ of the switching device (IGBT) 133*a* increases according to a time constant determined based upon the resistor 130*a*, the capacitor 131*a* and the resistor 132*a* and the gate capacitance of the switching device (IGBT) 133*a*.

This time constant is determined so that the gate voltage $V_{GE33}$of the switching device (IGBT) 133*a* can continue to keep the voltage enough to keep the switching device non-conductive for time enough for magnetic energy stored in the core of the transformer 103 to be consumed.

b-18: Before the gate voltage $V_{GE33}$ Of the switching device (IGBT) 133 is the threshold 0 V or more and after magnetic energy stored in the core of the transformer 103 is consumed, the level of an input signal N is changed from 0 V to a level at which the N channel MOSFET 114 can be turned on (for example, +5 V).

Afterward, b-6 to b-18 are repeated.

The same operation is also performed at the same timing in the driving sections of the switching device (IGBT) 133*b* at another stage and others.

FIG. 2(*c*) shows The switching operation of the semiconductor switch (The switching operation of IGBT by switching positive voltage and negative voltage).

The operation in the primary side area 101 of the semiconductor switch driving circuit in this operation is as described in the following c-1 to c-8.

c-1: Signals N and NL input to the primary side area 101 of the semiconductor switch driving circuit are made to 0 V on the circuit.

c-2: The level of an input signal PL is changed from 0 V to a level at which the bipolar transistor 108 can be turned on (for example, +5 V).

c-3: The bipolar transistor 108 becomes a conducting state.

c-4: The P channel MOSFET 110 becomes a conducting state.

c-5: After time enough to turn off the bipolar transistor 120 and the P channel MOSFET 122 elapses (for example, in 1 μs.) after the input signal NL is made to 0 V, the level of an input signal P is changed from 0 V to a level at which the N channel MOSFET 126 can be turned on (for example, +5 V).

c-6: The N channel MOSFET 126 becomes a conducting state.

c-7: Current flows (from the terminal 127*c* to the terminal 127*d*) in the primary winding of the transformer 103 from the center tap toward the N channel MOSFET 126.

c-8: Electromotive force V2p which is positive on the side of the terminal 127*e* and is negative on the side of the terminal 127*f* (is similarly positive on the side of the terminal 127*g* and is similarly negative on the side of the terminal 127*h*) is generated at both ends of each secondary winding of the transformer 103.

$$V2p=V1\times N2/N1 \tag{10}$$

V1 denotes voltage applied between the terminals 127*c* and 127*d* of the transformer 103, N1 denotes the number of turns between the terminals 127*c* and 127*d* and between the terminals 127*a* and 127*b* of the transformer 103 and N2 denotes the number of turns between the terminals 127*e* and 127*f* and between the terminals 127*g* and 127*h* of the transformer 103.

Next, the operation in the secondary side area 102 of the semiconductor switch driving circuit in this operation is as described in the following c-9 to c-34.

The driving section of one switching device (IGBT) 133*a* of the semiconductor switch at plural stages will be described, however, the operation of the switching device (IGBT) 133*b* at another stage and others is also similar.

c-9: Electromotive force V2p at both ends of each secondary winding increases and exceeds voltage acquired by adding Zener voltage $V_{z29}$ of the Zener diode 129*a* and the dropout voltage $V_{f28}$ in a forward direction of the Zener diode 128*a*.

$$V2p>V_{z29}+V_{f28}$$

c-10: The Zener diode 129*a* becomes a conducting state.

c-11: The capacitor 131*a* is charged (the side of the Zener diode 129*a* is positive) and the gate capacitance of the switching device (IGBT) 133*a* is charged (the side of the gate is positive) via the resistor 132*a*.

c-12: The gate voltage $V_{GE33}$ of the switching device (IGBT) 133 exceeds the gate threshold voltage $V_{GE(TH)}$ (refer to a mathematical equation 12) and the switching device (IGBT) 133*a* becomes a conducting state.

$$V_{GE33}>V_{GE<TH>}$$

c-13: After the gate voltage $V_{GE33}$ of the switching device (IGBT) 133*a* becomes at a level (for example, +15 V) enough to keep the switching device conducting (for example, in 2.5 μs.), an input signal P is made to 0 V.

c-14: The N channel MOSFET 126 becomes a non-conducting state.

c-15: Back electromotive force which is positive on the side of the terminal 127*d* and is negative on the side of the terminal 127*a* is caused on the primary winding of the transformer 103, however, as the terminal 127*a* at one end of the winding is connected to a power source via the P channel MOSFET 110 and the diode 111 which are respectively in a conducting state, back electromotive force $V1_{rev}$ caused between the terminals 127*a* and 127*d* is inhibited as shown in the following mathematical equation 13.

$$V1_{rev}=(V_{ds10}+V_{f11})\times 2$$

$V_{ds10}$ denotes the dropout voltage of the P channel MOSFET 110 and $V_{f11}$ denotes the dropout voltage in a forward direction of the diode 111.

c-16: Electromotive force $V2p_{rev}$ which is positive on the side of the terminal 127*f* and is negative on the side of the terminal 127*e* is also generated on the secondary winding by back electromotive force $V1_{rev}$ caused on the primary winding of the transformer 103, however, the level is Zener voltage $V_{z28}$ of the Zener diode 128*a* or less and the circuit on the secondary side becomes a non-conducting state by the Zener diode 128*a*.

$$V2p_{rev}=(V1_{rev}\times N2/N1)<V_{z28} \tag{14}$$

c-17: The gate voltage $V_{GE33}$ of the switching device (IGBT) 133*a* decreases according to a time constant determined based upon the resistor 130*a*, the capacitor 131*a* and the resistor 132*a* and the gate capacitance of the switching device (IGBT) 133*a*.

This time constant is determined so that the gate voltage $V_{GE33}$ Of the switching device (IGBT) 133*a* can continue keeping the voltage enough to keep the switching device conducting for time enough for magnetic energy stored in the core of the transformer 103 to be consumed.

c-18: Before the gate voltage $V_{GE33}$Of the switching device (IGBT) 133 is the gate threshold voltage $V_{GE<TH>}$ or less and after magnetic energy stored in the core of the transformer 103 is consumed, the level of the input signal PL is made to 0 V. Simultaneously, the level of the input signal NL is changed from 0 V to a level at which the bipolar transistor 120 can be turned on (for example, +5 V).

c-19: The bipolar transistor 120 becomes a conducting state.

c-20: The P channel MOSFET 122 becomes a conducting state.

c-21: After time enough to turn off the bipolar transistor 108 and the P channel MOSFET 110 elapses (for example, in 1 μs.) after the input signal PL is made to 0 V, the level of an input signal N is changed from 0 V to a level at which the N channel MOSFET 114 can be turned on (for example, +5 V).

c-22: The N channel MOSFET 114 becomes a conducting state.

c-23: Current flows (from the terminal 127*b* to the terminal 127*a*) in the primary winding of the transformer 103 from the center tap toward the N channel MOSFET 114.

c-24: Electromotive force V2n which is positive on the side of the terminal 127*f* and is negative on the side of the terminal 127*e* (is similarly positive on the side of the terminal 127*h* and is similarly negative on the side of the terminal 127*g*) is generated at both ends of each secondary winding of the transformer 103 (refer to a mathematical equation 15).

$$V2n = V1 \times N2/N1 \tag{15}$$

V1 denotes voltage applied between the terminals 127*b* and 127*a* of the transformer 103, N1 denotes the number of turns between the terminals 127*a* and 127*b* (and between the terminals 127*c* and 127*d*) of the transformer 103 and N2 denotes the number of turns between the terminals 127*e* and 127*f* (and between the terminals 127*g* and 127*h*) of the transformer 103.

c-25: Electromotive force V2n at both ends of each secondary winding increases and exceeds voltage acquired by adding Zener voltage $V_{z28}$ of the Zener diode 128*a* and the dropout voltage $V_{f29}$ in a forward direction of the Zener diode 129*a*.

$$V2n > V_{z28} + V_{f29} \tag{16}$$

c-26: The Zener diode 128*a* becomes a conducting state.

c-27: The capacitor 131*a* is charged (the side of the Zener diode 129*a* is negative) and the gate capacitance of the switching device (IGBT) 133*a* is charged (the side of the gate is negative) via the resistor 132*a*.

c-28: The gate voltage $V_{GE}$ of the switching device (IGBT) 133*a* becomes negative and the switching device is forcedly non-conducting.

c-29: After the gate voltage $V_{GE}$ of the switching device (IGBT) 133*a* becomes at a level (for example, −15 V) enough to keep the switching device non-conducting (for example, in 2.5 μs.), the input signal N is made to 0 V.

c-30: The N channel MOSFET 114 becomes a non-concluding state.

c-31: Back electromotive force which is positive on the side of the terminal 127*a* and is negative on the side of the terminal 127*d* is caused on the primary winding of the transformer 103, however, as the terminal 127*d* at one end of the winding is connected to a power source via the P channel MOSFET 122 and the diode 123 which are respectively in a conducting state, the caused back electromotive force $V1_{rev}$ is inhibited as shown in a mathematical equation 17.

$$V1_{rev} = (V_{ds22} + V_{f23}) \times 2 \tag{17}$$

$V_{d22}$ denotes the dropout voltage of the P channel MOSFET 122 and $V_{f23}$ denotes the dropout voltage in a forward direction of the diode 123.

c-32: Electromotive force $V2n_{rev}$ which is positive on the side of the terminal 127*e* and is negative on the side of the terminal 127*f* is also generated on the secondary winding by back electromotive force $V1_{rev}$ caused on the primary winding of the transformer 103, however, the level is Zener voltage $V_{z29}$ of the Zener diode 129*a* or less and the secondary side becomes a non-concluding state by the Zener diode 129*a*.

$$V2n_{rov} = (V1_{rev} \times N2/N1) < V_{z29} \tag{18}$$

c-33: The gate voltage $V_{GE33}$ of the switching device (IGBT) 133*a* increases according to a time constant determined based upon the resistor 130*a*, the capacitor 131*a* and the resistor 132*a* and the gate capacitance of the switching device (IGBT) 133*a*.

This time constant is determined so that the gate voltage $V_{GE33}$ of the switching device (IGBT) 133*a* can keep the voltage enough to keep the switching device non-conducting for time enough for magnetic energy stored in the core of the transformer 103 to be consumed.

c-34: Before the gate voltage $V_{GE33}$ of the switching device (IGBT) 133*a* is the threshold 0 V or more and after magnetic energy stored in the core of the transformer 103 is consumed, the level of the input signal NL is made to 0 V. Simultaneously, the level of the input signal PL is changed from 0 V to a level at which the bipolar transistor 108 can be turned on (for example, +5 V).

Afterward, c-3 to c-34 are repeated.

The same operation is also performed at the same timing in the driving sections of the switching device (IGBT) 133*b* at another stage and others.

As the semiconductor switch driving circuit equivalent to this embodiment can be used for a semiconductor switch of a circuit for generating a high-voltage electric pulse, a high-voltage electric pulse can be stably supplied from the output terminal of electrotherapy apparatus provided with the semiconductor switch to an outside living body. Also, the semiconductor switch circuit equivalent to this embodiment can perform high-speed switching operation about 35 Hz.

As described above in detail, in the semiconductor switch driving circuit according to the first aspect, as voltage between the gate and the emitter of the switching device can be continuously kept positive, voltage between the gate and the emitter can be continuously kept negative, voltage between the gate and the emitter can be alternately switched to positive voltage or negative voltage, the stable conducting state of the semiconductor switch can be kept, the stable non-conducting state of the semiconductor switch can be kept.

As the semiconductor switch driving circuit according to the second and third aspect causes or prevents current to flow for switching when a control signal is input, the semiconductor switch which can be operated in synchronization with an input control signal can be realized.

As the semiconductor switch driving circuit according to the fourth aspect is configured so that the source of the P channel MOSFET is connected to the power terminal, the drain of the P channel MOSFET is connected to the anode of the diode, the cathode of the diode is connected to the terminal at one end of the primary winding of the transformer and back electromotive force between the terminal at one end of the primary winding of the transformer and the terminal at the other end of the primary winding of the transformer can be inhibited by placing the P channel MOSFET into a conducting state, the stable operation of the semiconductor switch can be realized by inhibiting the back electromotive force.

The semiconductor switch driving circuit according to the fifth aspect can transmit power for controlling plural switching devices to the secondary side area by the circuit configuration in the primary side area, can absorb back electromotive force caused when current flowing in the transformer is cut off and the stable operation of the semiconductor switch can be realized by the simple circuit and the small number of parts.

As the semiconductor switch driving circuit according to the sixth aspect is provided with plural switching devices and plural gate driving sections that directly drive the switching devices in the secondary side area and the switching devices are connected in series, the withstand voltage of the semiconductor switch against the application of high voltage has a value acquired by adding the withstand voltage of the switching device itself at each stage and the high-withstand voltage semiconductor switch can be realized.

As the switching device in the semiconductor switch driving circuit according to the seventh aspect is an insulated gate bipolar transistor (IGBT), the semiconductor switch which can use the device (IGBT) provided with both the low saturation voltage characteristic of the bipolar transistor and the switching characteristic of power MOSFET can be realized.

As the semiconductor switch driving circuit according to the eighth aspect is provided with the Zener diode for preventing electromotive force caused on the secondary winding by back electromotive force caused on the primary winding of the transformer in the secondary side area, the stable operation of the semiconductor switch can be realized.

As in the secondary side of the semiconductor switch driving circuit according to the ninth aspect, the terminal at one end of the secondary winding of the transformer is connected to the anode of the first Zener diode, the anode of the second Zener diode the cathode of which is directly connected to the cathode of the first Zener diode in series with both cathodes face to face is connected to the gate of the specific switching device via the first resistor, the terminal at the other end of the secondary winding of the transformer is connected to the emitter of the specific switching device, the second resistor and the capacitor are connected between the anode of the second Zener diode and the emitter of the specific switching device and the plural specific switching devices are provided, the stable semiconductor switch which receives power supplied from the primary side area, can transmit the power for controlling the plural switching devices to the plural switching devices and can reduce a lag of switching timing between the switching devices can be realized by the simple circuit and the small number of parts.

As the electrotherapy apparatus according to the tenth aspect can keep the stable conducting state of the semiconductor switch, can keep the stable non-conducting state of the semiconductor switch, enables the switching operation of the semiconductor switch, can minimize a lag of the switching timing of each switching device and can realize the semiconductor switch by the simple circuit and the small number of parts respectively by using the semiconductor switch driving circuit according to any of the first to the ninth aspects for the semiconductor switch of the circuit for generating a high-voltage electric pulse, the electrotherapy apparatus ensuring high operational stability can be provided at lower cost.

What is claimed is:

1. A semiconductor switch driving circuit comprising:

a transformer;

at least one switching device, each comprising a gate terminal and an emitter terminal;

a primary side area provided on a primary side of the transformer for controlling current on the primary side of the transformer according to a control signal for controlling the at least one switching device; and a secondary side area provided on a secondary side of the transformer for directly driving the at least one switching device, wherein the primary side area and the secondary side area are arranged so as to select one operation from a first operation mode in which a voltage between the gate terminal and the emitter terminal of the at least one switching device is kept either positive or negative during at least one cycle of the control signal and a second operation mode in which the voltage between the gate terminal and the emitter terminal of the at least one switching device is switched between positive and negative within one cycle of the control signal and perform the selected operation.

2. A semiconductor switch driving circuit according to claim 1, wherein, the primary side area is arranged so that power for controlling the at least one switching device is transmitted to the secondary side area, and back electromotive force caused when current flowing in the transformer is cut off is absorbed.

3. A semiconductor switch driving circuit according to claim 1, wherein the secondary side area receives a power supplied from the primary side area and transmits the power to a plurality of switching devices, such that the plural switching devices simultaneously operates in an identical manner.

4. A semiconductor switch driving circuit according to claim 3, wherein the switching devices are connected in series.

5. A semiconductor switch driving circuit according to claim 4, wherein the switching device is an insulated gate bipolar transistor (IGBT).

6. A semiconductor switch driving circuit according to claim 1, wherein;

a source of a P channel MOSFET is connected to a power terminal;

a drain of the P channel MOSFET is connected to an anode of the diode;

a cathode of the diode is connected to a first terminal of a primary winding of the transformer, so that back electromotive force between the first terminal and a second terminal of the primary winding of the transformer is inhibited when the P channel MOSFET conducts.

7. A semiconductor switch driving circuit according to claim 1, wherein;

a first control signal input terminal (PL) from which the control signal is input is connected to a base of a first NPN bipolar transistor (108) via a resistor (105) and a capacitor (104) respectively connected in parallel;

the base and an emitter of the first NPN bipolar transistor (108) are connected via a resistor (106) and the emitter is grounded;

a collector of the first NPN bipolar transistor (108) is connected to a gate of a first P channel MOSFET (110) via a resistor (107);

the gate and a source of the first P channel MOSFET (110) are connected via a resistor (109) and the source is connected to a power terminal (VDD), a drain of the P channel MOSFET (110) is connected to an anode of a diode (111);

a cathode of the diode (111) is connected to a drain of a first N channel MOSFET (114) and a first terminal (127*a*) of a primary winding of a transformer (127);

a gate and a source of the first N channel MOSFET (114) are connected via a resistor (113) and the source is grounded;

a second control signal input terminal (N) from which the control signal is input is connected to the gate of the first N channel MOSFET (114) via a resistor (112), a third control signal input terminal (NL) from which the control signal is input is connected to a base of a second NPN bipolar transistor (120) via a resistor (117) and a capacitor (116) respectively connected in parallel;

a base and an emitter of the second NPN bipolar transistor (120) are connected via a resistor (118) and the emitter is grounded;

a collector of the second NPN bipolar transistor (120) is connected to a gate of a second P channel MOSFET (122) via a resistor (119);

the gate and a source of the second P channel MOSFET (122) are connected via a resistor (121) and the source is connected to the power terminal (VDD);

a drain of the second P channel MOSFET (122) is connected to an anode of a diode (123);

a cathode of the diode (123) is connected to a drain of a second N channel MOSFET (126) and a second terminal (127*d*) of the primary winding of the transformer (127);

a gate and a source of the second N channel MOSFET (126) are connected via a resistor (125) and the source is grounded;

a fourth control signal input terminal (P) from which the control signal is input is connected to the gate of the second N channel MOSFET (126) via a resistor (124); and third and fourth terminals (127*b*, 127*c*) of the primary winding of the transformer (127) are connected to a center tap (135) which is connected to the power terminal (VDD) and is grounded via a capacitor (115).

8. A semiconductor switch driving circuit according to claim 1, wherein the secondary side area has a Zener diode for preventing electromotive force generated on a secondary winding by back electromotive force caused on a primary winding of the transformer.

9. A semiconductor switch driving circuit according to claim 1, wherein;

a first terminal of a secondary winding of the transformer is connected to a first Zener diode;

a second Zener diode is connected to a gate of one of the at least one switching device via a first resistor;

terminals of the first Zener diode and the second Zener diode having the same polarity are directly connected in series;

a second terminal of the secondary winding of the transformer is connected to an emitter of the one of the at least one specific switching device; and a second resistor and a capacitor are connected between the second Zener diode and the emitter of the one of the at least one switching device.

10. An electrotherapy apparatus for adapted to supply a high-voltage electric pulse to a living body, comprising:

a semiconductor switch driving circuit comprising:

a transformer;

at least one switching device, through which the high-voltage electric pulse is supplied, each switching device comprising a gate terminal and an emitter terminal;

a primary side area provided on a primary side of the transformer for controlling current Qn the primary side of the transformer according to a control signal for controlling the at least one switching device; and a secondary side area provided on a secondary side of the transformer for directly driving the at least one switching device, wherein, the primary side area and the secondary side area are arranged so as select one operation from a first operation mode in which a voltage between the gate terminal and the emitter terminal of the at least one switching device is kept either positive or negative during at least one cycle of the control signal, and a second operation mode in which the voltage between the gate terminal and the emitter terminal of the at least one switching device switched between positive and negative within one cycle of the control signal and perform the selected operation.

* * * * *